(12) United States Patent
Nakata

(10) Patent No.: US 7,220,997 B2
(45) Date of Patent: May 22, 2007

(54) LIGHT RECEIVING OR LIGHT EMITTING DEVICE AND ITSD PRODUCTION METHOD

(76) Inventor: Josuke Nakata, 29-3, Goryoooeyama-cho, 4-chome Nishikyo-ku, Kyoto-shi, Kyoto, 610-1102 (JP)

( * ) Notice: Subject to any disclaimer, the term of this patent is extended or adjusted under 35 U.S.C. 154(b) by 41 days.

(21) Appl. No.: 10/511,959
(22) PCT Filed: Jun. 21, 2002
(86) PCT No.: PCT/JP02/06251
  § 371 (c)(1), (2), (4) Date: Nov. 10, 2004
(87) PCT Pub. No.: WO04/001858
  PCT Pub. Date: Dec. 31, 2003

(65) Prior Publication Data
  US 2006/0086384 A1  Apr. 27, 2006

(51) Int. Cl.
  *H01L 29/18* (2006.01)
(52) U.S. Cl. .......................... 257/88; 257/81
(58) Field of Classification Search ................... 257/80, 257/81, 83, 84, 431, 433, 459, 88
  See application file for complete search history.

(56) References Cited

U.S. PATENT DOCUMENTS

| | | |
|---|---|---|
| 3,038,952 A | 6/1962 | Ralph |
| 3,350,775 A | 11/1967 | Iles |
| 3,433,676 A | 3/1969 | Stein |
| 3,998,659 A | 12/1976 | Wakefield |
| 4,021,323 A | 5/1977 | Kilby et al. |
| 4,126,812 A | 11/1978 | Wakefield |
| 4,224,081 A | 9/1980 | Kawamura et al. |
| 4,581,103 A | 4/1986 | Levine et al. |

(Continued)

FOREIGN PATENT DOCUMENTS

EP  0 866 506  9/1998

(Continued)

OTHER PUBLICATIONS

U.S. Appl. No. 10/169,017, Nakata.

*Primary Examiner*—Wai-Sing Louie
*Assistant Examiner*—Mursalin B. Hafiz
(74) *Attorney, Agent, or Firm*—Jordan and Hamburg LLP

(57) ABSTRACT

A light-receiving device incorporating particulate semiconductor devices (solar cells) having a light-to-electricity transducing function or a light-emitting device incorporating particulate semiconductor devices (light-emitting diodes) having an electricity-to-light transducing function. In a solar cell panel shown, solar cells are arrayed on the same plane in rows. Each row of solar cells are parallel interconnected through positive electrode wires and negative electrode wires, and solar cells of adjoining rows are interconnected in series through a connection part. These solar cells connected in parallel and in series are covered with a transparent covering member, thus forming a panel. These solar cells each have externally exposed positive and negative electrode terminals, and therefore the solar cells can be interconnected in parallel, in series, or in parallel and series. When the conductive wires and the covering member are flexible, the device can be deformable. When the solar cells are replaced with light-emitting diodes, the device can be a light-emitting one.

14 Claims, 11 Drawing Sheets

U.S. PATENT DOCUMENTS

| | | | |
|---|---|---|---|
| 4,582,588 A | 4/1986 | Jensen et al. |
| 4,583,588 A | 4/1986 | Franzolini et al. |
| 4,691,076 A | 9/1987 | Levine et al. |
| 5,028,546 A | 7/1991 | Hotchkiss |
| 5,419,782 A | 5/1995 | Levine et al. |
| 5,428,249 A | 6/1995 | Sawayama et al. |
| 5,431,127 A | 7/1995 | Stevens |
| 5,469,020 A | 11/1995 | Herrick |
| 5,498,576 A | 3/1996 | Hotchkiss et al. |
| 5,538,902 A | 7/1996 | Izu et al. |
| 6,204,545 B1 | 3/2001 | Nakata |
| 6,265,242 B1 | 7/2001 | Komori et al. |
| 6,294,822 B1 | 9/2001 | Nakata |
| 6,355,873 B1 | 3/2002 | Ishikawa |
| 6,744,073 B1 * | 6/2004 | Nakata | 257/81 |
| 7,109,528 B2 | 9/2006 | Nakata |
| 2004/0238833 A1 | 12/2004 | Nakata |
| 2005/0067622 A1 | 3/2005 | Nakata |
| 2005/0127379 A1 | 6/2005 | Nakata |
| 2006/0043390 A1 | 3/2006 | Nakata |
| 2006/0086384 A1 | 4/2006 | Nakata |
| 2006/0133073 A1 | 6/2006 | Nakata et al. |
| 2006/0169992 A1 | 8/2006 | Nakata |

FOREIGN PATENT DOCUMENTS

| | | |
|---|---|---|
| EP | 0 982 780 | 3/2000 |
| EP | 1 255 303 | 11/2002 |
| GB | 1195547 | 6/1970 |
| JP | 61-158372 | 7/1986 |
| JP | 1-179374 | 7/1989 |
| JP | 5-36997 | 2/1993 |
| JP | 6-013633 | 1/1994 |
| JP | 8-199513 | 8/1996 |
| JP | 9-49213 | 2/1997 |
| JP | 9-162434 | 6/1997 |
| JP | 09-162434 | 6/1997 |
| JP | 10-33969 | 2/1998 |
| JP | 2000-22184 | 1/2000 |
| JP | 2000-259992 | 9/2000 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | WO-98/15983 | 4/1998 |
| WO | WO-98/36461 | 8/1998 |
| WO | WO-01/99202 | 12/2001 |

* cited by examiner

ID AND ITSD PRODUCTION METHOD

LIGHT RECEIVING OR LIGHT EMITTING DEVICE AND ITSD PRODUCTION METHOD

TECHNICAL FIELD

The present invention relates to a light receiving or light emitting device which can be deformed and simply manufactured by electrically connecting particulate light receiving or light emitting semiconductor elements by means of linear conductive members, and then sealing these elements with synthetic resin, and a method for manufacturing the same.

BACKGROUND OF THE INVENTION

Conventional solar cells are constructed with a flat-plate-form structure overall, in which an n type diffusion layer is formed in the surface of a p type semiconductor substrate, a herring-bone-type light receiving surface electrode is formed near the front surface, and a back surface electrode is formed near the back surface. In the case of such flat-plate-form solar cells, when the angle of incidence of sunlight on the solar cell becomes large in the morning or evening, the reflectivity at the surface increases, so that the proportion of the sunlight that enters the interior of the solar cell drops.

In the past, therefore, various types of solar cell panels using solar cells comprising spherical semiconductor cells with a diameter of approximately 1 to 2 mm have been proposed. For example, the inventor of the present application has proposed a solar cell and light emitting device comprising a spherical semiconductor element as indicated in WO 98/15983. In such devices, a diffusion layer, a pn junction and a pair of electrodes positioned on both ends with the center of the single crystal silicon interposed are formed on a spherical p type or n type single crystal of silicon. Numerous solar cells of the abovementioned type are disposed in the form of a matrix that has numerous rows and numerous columns; these cells are connected in series and parallel, and are sealed in embedded form by a transparent synthetic resin, thus producing a solar cell panel. This solar cell is advantageous in that a plurality of solar cells of this type can be connected in series, since a pair of electrodes are formed on both ends of the solar cell. However, it is not easy to arrange a plurality of the solar cells in the form of a matrix, and to connect these numerous solar cells in a series-parallel connection.

For example, the inventor of the present application attempted to dispose a plurality of solar cells in the form of a matrix in a sandwich configuration between two printed boards.

In this case, however, a plurality of solar cells must be precisely positioned on one printed board, and numerous electrodes must be connected; furthermore, another printed board must be superimposed on this assembly, and numerous electrodes must be connected here as well. Accordingly, the structure of the solar cell panel becomes complicated, the size of the panel is increased, and the cost of parts and cost of assembly are increased, so that the manufacturing cost of the solar cell panel is increased.

Here, panels with various types of structures have been proposed as solar cell panels in which numerous spherical solar cells are disposed in the form of a matrix.

A solar cell panel in which numerous solar cells are connected in parallel via two sheets of aluminum foil is proposed in Japanese patent laid-open publication No. 6-13633.

In the solar cell panel or solar cell sheet described in Japanese patent laid-open publication No. 9-162434, a mesh is constructed from insulating warp filaments and first and second woof filaments on which different metal coating films are formed; furthermore, numerous spherical elements in which a diffusion layer is formed on the surface of a p type spherical single crystal of silicon are manufactured, these spherical elements are disposed in the respective eyes of the abovementioned mesh, the first woof filaments are connected to the diffusion layers, the second woof filaments are connected to the spherical single crystal of silicon, and these elements are sealed with synthetic resin.

In the case of this solar cell panel, the manufacture of the mesh having a special structure is not easy, and the manufacturing cost is also high. Furthermore, since the spherical elements do not have electrodes, the first woof filaments must be coated with a substance that does not form an alloy with the p type spherical elements, and the second woof filaments must be coated with a substance that forms an alloy with the p type spherical elements so that non-rectified contact is possible. Accordingly, there are restrictions on the substances that are respectively used to coat the first and second woof filaments, so that it is difficult to lower the manufacturing cost. The second woof filaments and the p type spherical elements are heated at the time of alloy formation; however, since there is a danger that the donor of the n type diffusion layer formed in the surface will be diffused by heating, there are also restrictions on the substances that can be used as a donor, and control of the heating temperature is also difficult.

In the photo power generating panel described in Japanese patent laid-open publication No. 2001-210834, numerous spherical elements are manufactured in which a diffusion layer is formed in the surface of a p type or n type spherical crystalline silicon, these spherical elements are inserted into numerous holes formed in a printed board, printed wiring is connected to the diffusion layers of the numerous spherical elements, the diffusion layers of the numerous spherical elements on the side of the back surface of the printed board are subsequently removed by etching, the printed board on which the numerous spherical elements have been incorporated is placed on top of another printed board, and the spherical crystals of the respective spherical elements are connected to the printed wiring. However, in the case of such a photo power generating panel, since the numerous spherical power generating elements are connected in parallel, the electromotive force of a single photo power generating panel cannot be increased, and since two printed boards are used, the cost of parts and cost of assembly are high, so that the manufacturing cost of the photo power generating panel is also increased. Since two printed boards are used, the panel tends to have a high rigidity, so that it is difficult to construct a photo power generating panel with flexibility. In all of the abovementioned panels, the gap between the electrodes is reduced as the spherical diameter is reduced, so that it is difficult to reduce the size of the panel. Furthermore, since the spherical light emitting elements do not have independent electrodes, individual testing for defective parts prior to the connection of the elements to the printed wiring is impossible.

Objects of the present invention are, to provide a light receiving or light emitting device in which numerous particulate semiconductor elements each of which has a pair of independent electrodes formed like a spot on both end parts are connected by means of conductive wire members, to provide a light receiving or light emitting device with flexibility, to provide a light receiving or light emitting device in which there are few restrictions on the material used as the conductive wire member, and to provide a light receiving or light emitting device in which numerous particulate semiconductor elements can be connected by parallel connections or series-parallel connections.

DISCLOSURE OF THE INVENTION

The light receiving or light emitting device of the present invention is a light receiving or light emitting device in which a plurality of particulate semiconductor elements that have a light-to-electricity transducing function or an electricity-to-light transducing function are incorporated lined up in at least one row, this device being characterized in that each of the semiconductor elements has a pair of electrodes that are disposed in spot form on both end parts of the element with the center thereof interposed, a pair of conductive wire members that connect the plurality of semiconductor elements in each row in parallel are provided, and a transparent covering material that covers all of the semiconductor elements and conductive wire members in embedded form is provided.

In this light receiving or light emitting device, since a plurality of semiconductor elements that have electrodes formed in spot form on both end parts with the center interposed are lined up in at least a single row, and the semiconductor elements of the respective rows are connected in parallel by a pair of conductive wire members, the electrical connection of numerous semiconductor elements can be accomplished in a simple manner. Since semiconductor elements on which pairs of electrodes are formed are incorporated, there is no need for a complicated process of forming ohmic contacts between the semiconductor elements and the conductive wiring members; the electrodes of the semiconductor elements and the conductive wire members can easily be electrically connected by means of a low melting point metal such as solder or the like. This light receiving or light emitting device can be molded in various shapes, and is deformable as a result of the use of a soft covering material, so that the device is superior in terms of all-purpose utility.

If necessary, the various constructions shown below can also be applicable in the present invention.

(a) A plurality of semiconductor elements are arranged in one row, and these conductive wire members and covering material possess flexibility and are constructed as a flexible cord.

(b) A plurality of semiconductor elements are arranged in a plurality of rows on the same plane, the conductive wire members and covering material possess flexibility, and the panel is constructed in the form of a panel with flexibility.

(c) A plurality of semiconductor elements are arranged in a plurality of rows on the same plane, the covering material is formed by a hard synthetic resin, and the panel is constructed in the form of a hard panel.

(d) The semiconductor elements in each row are connected in series to semiconductor elements in the rows adjacent to this row by the conductive wire members.

(e) Each of the semiconductor elements comprises a spherical element main body made of a p type or n type semiconductor, and a pn junction, and the pair of electrodes are connected to both ends of the pn junction.

(f) Each of semiconductor elements comprises a cylindrical element main body made of a p type or n type semiconductor, and a pn junction, and the pair of electrodes are connected to both ends of the pn junction.

(g) The semiconductor elements consist of light receiving elements, and the panel is a solar cell panel that receives sunlight and converts this light into electricity.

(h) The semiconductor elements consist of light emitting elements, and the panel is a surface-emitting light emitting panel.

(i) Partially cylindrical lens parts that correspond to the semiconductor elements of the respective rows are formed in the vicinity of the surface of the covering material.

(j) A protective film is formed on at least one surface of the covering material.

(k) A reflective film that reflects light is formed on any one surface portion of the covering material.

The light receiving or light emitting device manufacturing method of the present invention is a method for manufacturing a light receiving or light emitting device in which a plurality of particulate semiconductor elements that have a light-to-electricity transducing function or an electricity-to-light transducing function are incorporated lined up in at least one row, comprising a first step in which a plurality of semiconductor elements, a temporary fastening plate to which plural conductive wire members are temporarily fastened and a retaining plate having a plurality of retaining holes are prepared, a second step in which the retaining plate is fitted into an opening part of the temporary fastening plate, respective semiconductor elements are fitted in the retaining holes, and intermediate portions in the direction of height of the semiconductor elements are held by the retaining holes, and a third step in which the pairs of electrodes of the semiconductor elements are electrically connected to the conductive wire members.

In this light receiving or light emitting device manufacturing method, since a retaining plate comprising a plurality of retaining holes is inserted into the opening part of a temporary fastening plate to which conductive wire members are temporarily fastened, a plurality of semiconductor elements are fitted in the plurality of retaining holes so that intermediate portions in the direction of height of the semiconductor elements are holed, and the pairs of electrodes of the semiconductor elements are electrically connected to the conductive wire members, a light receiving or light emitting device that possesses the various effects and merits described above can be manufactured easily and inexpensively.

In the third step of this manufacturing method, the pairs of electrodes of the semiconductor elements may also be electrically connected to the conductive wire members by irradiating a metal film with a low melting point formed on the surface of the electrodes with a heating beam.

PREFERRED EMBODIMENT OF THE INVENTION

Figure 1:
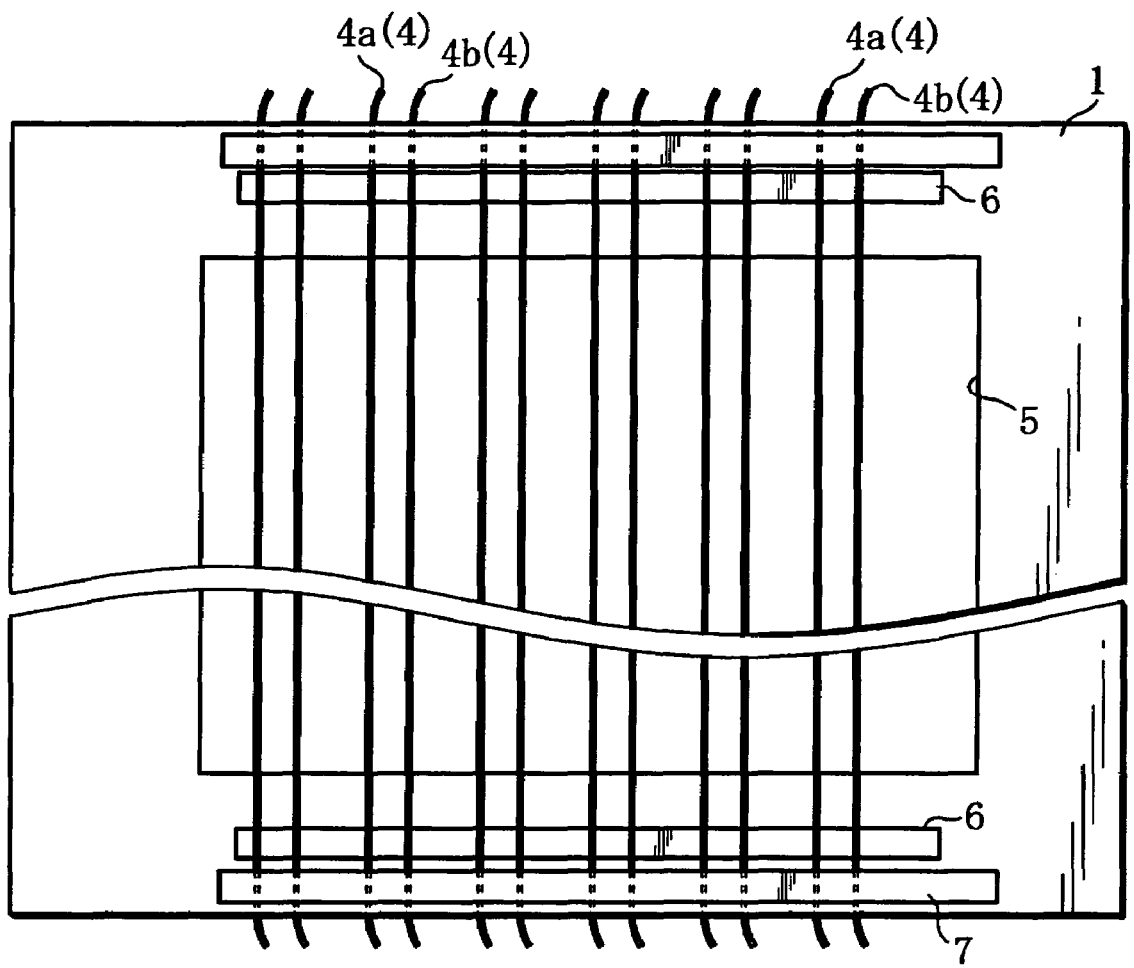
FIG. 1 is a plan view of the temporary fastening plate and conductive wire members in the present embodiment.

An embodiment of the present invention will be described below with reference to the attached drawings.

The present embodiment is one example of a case in which the present invention is applied to a cord-form solar cell used as a light receiving device. First, the method of manufacture and structure of this solar cell will be described. First of all, in a first step, as is shown in FIGS. 1 through 5, a temporary fastening plate 1 to which twelve conductive wire members 4 (positive pole wire members 4*a* and negative pole wire members 4*b*) are fastened, a retaining plate 2, and (for example) 120 semiconductor elements 3 (hereafter referred to as "solar cells"), are prepared.

The temporary fastening plate 1 is a rectangular plate with a thickness of approximately 1 to 2 mm constructed from a hard synthetic resin (e.g., a phenol type or epoxy type synthetic resin) or the like.

A rectangular opening part 5 that is used to insert the retaining plate 2, and a pair of projecting strips 6 in which twelve grooves used for the alternate temporary fastening of positive pole wire members 4*a* and negative pole wire members 4*b* in facing positions on the front and rear with the opening part 5 interposed are formed, are formed in this temporary fastening plate 1. The conductive wire members 4 possess flexibility and conductivity, and are (for example) metal wire members (e.g., wire members made of copper, aluminum, silver, gold or the like) with a diameter of approximately 0.2 to 0.3 mm. The twelve wire members 4 are respectively temporarily fastened in the grooves of the projecting strips 6, and are arranged as shown in the drawings, with both end parts being fastened by tapes 7 used for temporary fastening. Respective pairs of positive pole wire members 4*a* and negative pole wire members 4*b* are disposed parallel to each other with a gap that is substantially equal to the diameter of the solar cells 3 being left between the wire members. The retaining plate 2 is a sheet-form plate with a thickness of approximately 1 to 2 mm which is constructed from the same hard synthetic resin as the temporary fastening plate 1; this retaining plate 2 is fitted into the opening part 5 of the temporary fastening plate 1.

Figure 2:
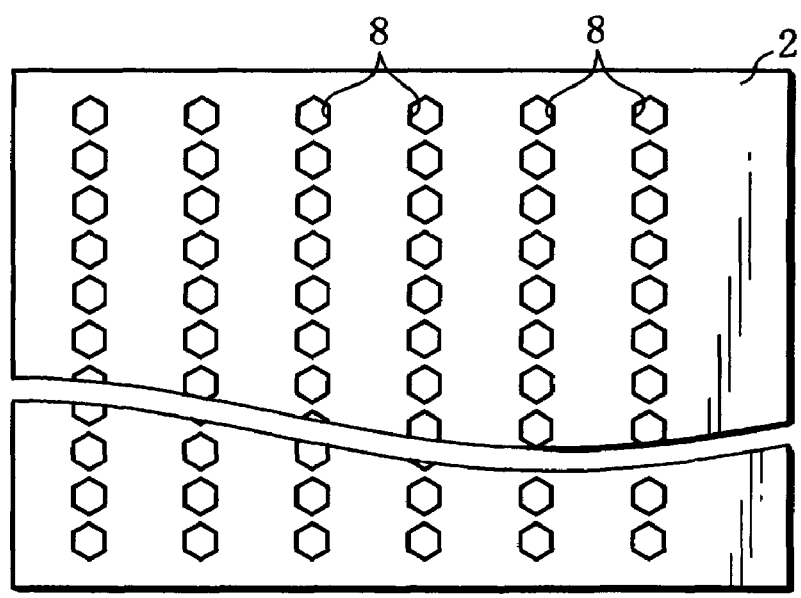
FIG. 2 is a plan view of the retaining plate.

As is shown in FIG. 2, 120 hexagonal retaining holes 8 that are used for the insertion of the solar cells 3 are formed in the retaining plate 2 in the form of a matrix with (for example) 20 rows and 6 columns. The retaining holes 8 of each column are formed so that these holes are disposed between the respective pairs of positive pole wire members 4*a* and negative pole wire members 4*b*. However, such an arrangement of the retaining holes 8 in 20 rows and 6 columns is merely an example; the present invention is not limited to 20 rows and 6 columns.

Figure 3:
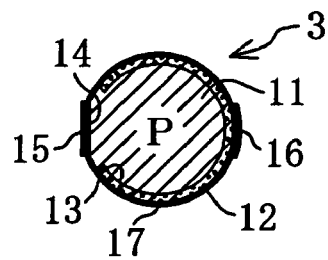
FIG. 3 is a sectional view of a solar cell.

As is shown in FIG. 3, the particulate solar cells 3 each have a spherical element main body 11 with a diameter of (e.g.) 1.0 to 1.5 mm consisting of p type single crystal silicon, an n type diffusion layer 12 (thickness: approximately 0.5 μm) in which (for example) phosphorus (P) is diffused in the surface portion of this element main body 11, a substantially spherical surface form pn junction 13 that is formed in the boundary between the element main body 11 and diffusion layer 12, a flat part 14 formed in one end portion of the element main body 11, in which no pn junction is formed, a pair of electrodes 15, 16 (positive pole 15 and negative pole 16) that are disposed in spot form on both end parts with the center of the element main body 11 interposed, solder coating films that are formed on the surfaces of the respective electrodes 15, 16, and an $SiO_2$ coating film 17 (thickness: approximately 0.4 μm) used for passivation which is formed on the surface of the diffusion layer 12 except for the areas of the pair of electrodes 15, 16.

For example, this solar cell 3 can be manufactured by the method proposed by the inventor of the present application in WO 98/15983. In this manufacturing method, a small piece of p type silicon is melted, and is allowed to drop freely from the upper end portion of a dropping tube. This silicon is solidified by radiant cooling when the silicon drops while being maintained in a spherical shape by the action of surface tension, so that a spherical single crystal silicon body is created. A diffusion layer 12, flat part 14, pair of electrodes 15, 16 and passivation coating film 17 are formed in this spherical single crystal silicon body by well known techniques such as etching, masking, diffusion treatments and the like.

Figure 4:
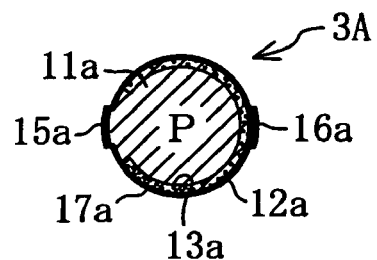
FIG. 4 is a sectional view of another solar cell.

The abovementioned pair of electrodes 15, 16 are respectively formed by (for example) baking an aluminum paste or silver paste. The diameter of the electrodes 15, 16 is approximately 300 to 500 μm, and the thickness is approximately 200 to 300 μm. However, the electrodes 15, 16 may also be formed by a plating process, or may be formed by some other method. Each solar cell 3 generates an electromotive force with an open-circuit voltage of approximately 0.6 V when the cell receives sunlight with a light intensity of 100 mW/cm². Here, in the solar cells 3, p type diffusion layers may be formed in n type silicon element main bodies, and a pair of electrodes and a passivation coating film may be formed in the same manner as described above. Alternatively, as is shown in FIG. 4, spherical solar cells 3A may be used in which the flat part 14 of the solar cells 3 is not formed, and a diffusion layer 12a, pn junction 13a, electrodes 15a, 16a, passivation film 17a are formed in an element main body 11a that is left in a spherical shape.

Figure 5:
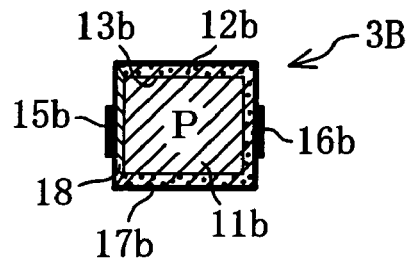
FIG. 5 is a sectional view of another solar cell.

Furthermore, the particulate semiconductor elements need not always be spherical; these elements may also be short cylindrical solar cells 3B as shown in FIG. 5. These solar cells 3B each comprise a short cylindrical element main body 11b consisting of p type single crystal silicon (e.g., 1.0 to 1.5 mm φ, 1.0 to 1.6 mm L), an n type diffusion layer 12b in the surface portion of this element main body 11b, a pn junction 13b, a p+ type diffusion layer 18 with a thickness of approximately 0.2 μm formed by the diffusion of boron (B), a pair of electrodes 15b, 16b (positive pole 15b and negative pole 16b) formed on both end parts in the axial direction of the element main body 11b, a passivation coating film 17b consisting of $SiO_2$.

Figure 6:
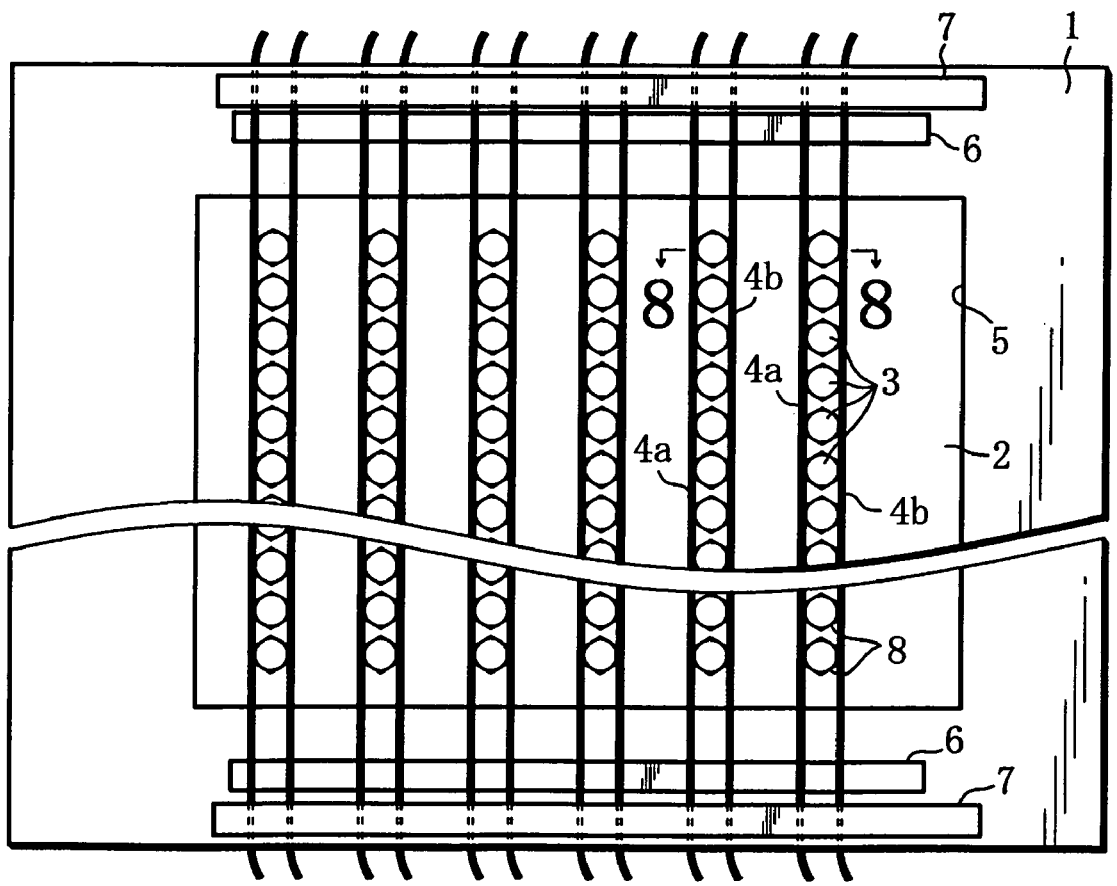
FIG. 6 is a plan view showing the retaining plate engaged with the temporary fastening plate, and solar cells inserted into the retaining holes.
Figure 7:
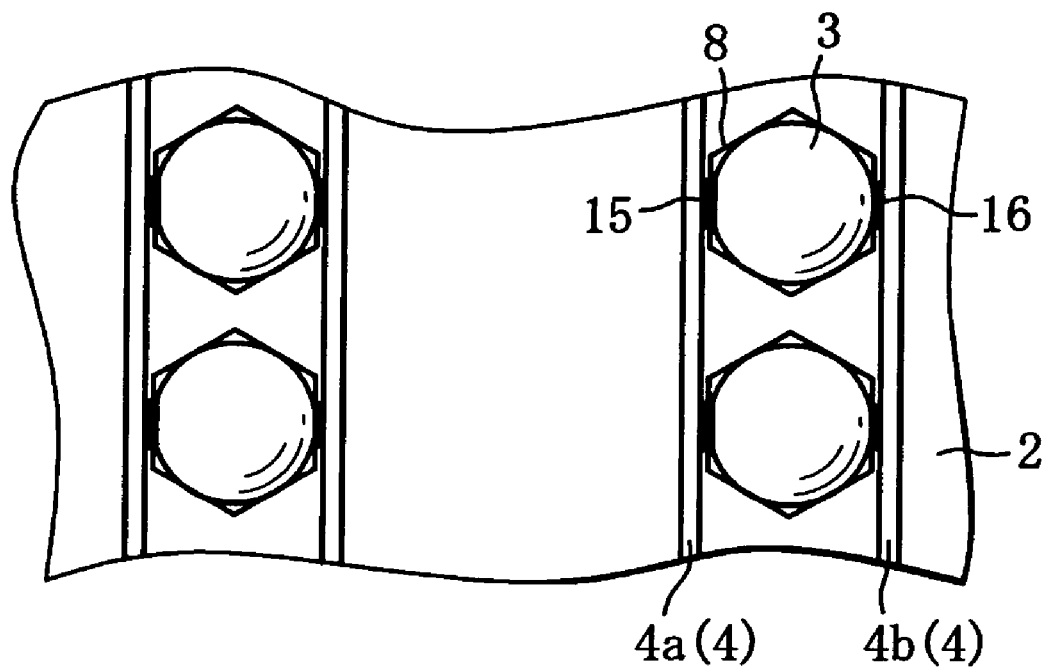
FIG. 7 is an enlarged view of essential parts in FIG. 6.

Next, in a second step, as is shown in FIG. 6, the retaining plate 2 is fitted into the opening part 5 of the temporary fastening plate 1, and solar cells 3 are respectively inserted into the 120 retaining holes 8 that are formed in the retaining plate 2. As is shown in FIG. 7, these solar cells 3 are placed in the retaining holes 8 with the direction of conduction uniformly arranged, and intermediate portions in the direction of height of the cells 3 are held by the retaining holes 8 so that the solder coating films of the positive poles 15 are caused to adhere tightly to the positive pole wire members 4a, and the solder coating films of the negative poles 16 are caused to adhere tightly to the negative pole wire members 4b. As is shown in FIG. 8, the solar cells 3 are mounted in a state in which the temporary fastening plate 1 and retaining plate 2 are placed on a working bench 20 so that the solar cells do not fall out of the retaining holes 8.

Figure 8:
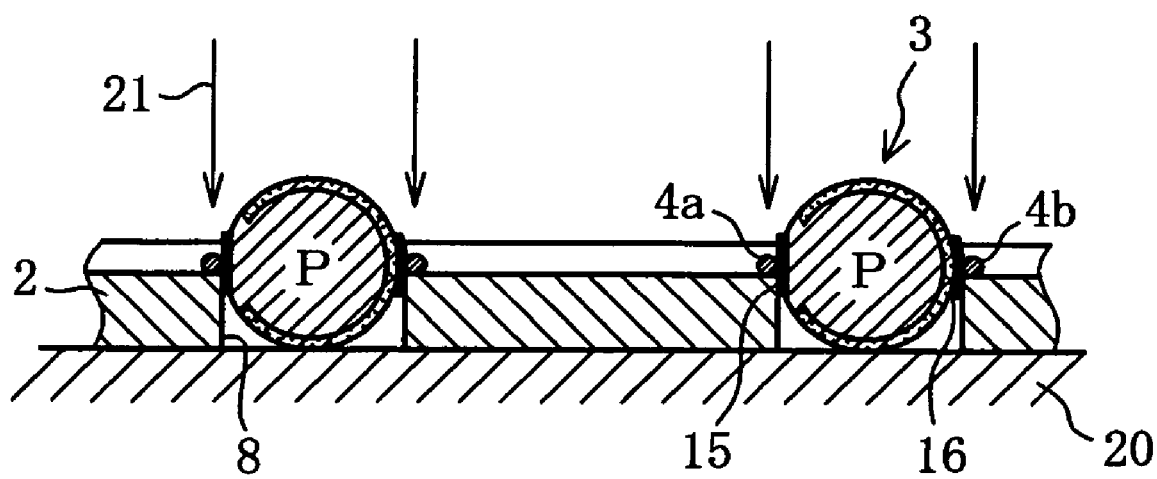
FIG. 8 is a sectional view along VIII-VIII line in FIG. 6.

Next, in a third step, as is shown in FIGS. 7 and 8, the contact parts between the positive pole wire members 4a and the solder coating films of the electrodes 15 and the contact parts between the negative pole wire members 4b and the solder coating films of the electrodes 16 are irradiated with a heating beam 21 (laser beam or infrared light beam), so that the positive pole wire members 4a and the electrodes 15 are electrically connected, and so that the negative pole wire members 4b and the electrodes 16 are electrically connected. In this way, the plurality of solar cells 3 in the respective columns are connected in parallel via the wire members 4a an 4b.

Next, in a fourth step, the retaining plate 2 is removed from the opening part 5 of the temporary fastening plate 1, and the wire members 4a and 4b and solar cells 3 of the respective columns are coated from both the upper and lower sides by placing a soft transparent synthetic resin (e.g., an EVA resin, silicone resin or the like) in a semi-molten state.

Figure 9:
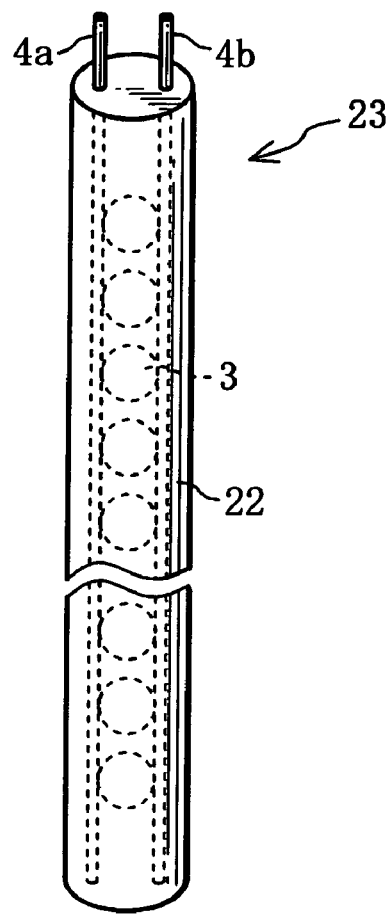
FIG. 9 is a perspective view of a cord-form solar cell.
Figure 10:
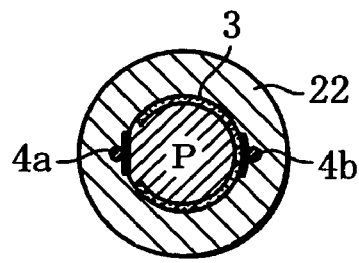
FIG. 10 is sectional view of a cord-form solar cell.
Figure 11:
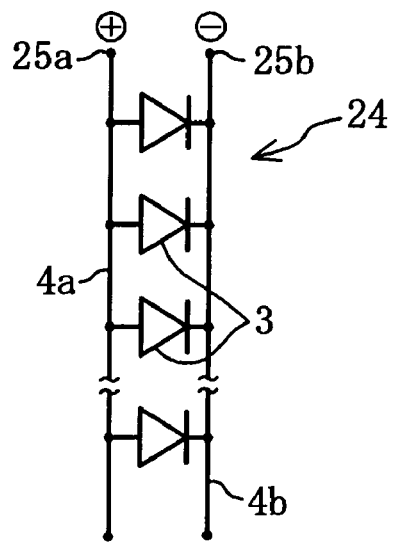
FIG. 11 is a circuit diagram of the equivalent circuit of the solar cell shown in FIG. 9.

Next, the solar cells 3 of the six columns are set in a specified metal mold of a molding apparatus together with the temporary fastening plate 1, and are compression-molded by an appropriate pressing force, so that a covering material 22 is formed which covers the wire members 4a and 4b and the 20 solar cells 3 in embedded form as shown in FIGS. 9 and 10. Thus, when the 20 solar cells 3 of each column covered by the covering material 22 are removed from the temporary fastening plate 1, and the excess portions of the wire members 4a and 4b are cut, flexible cord-form solar cells 23 are completed with a cylindrical shape having a length of approximately 10 cm as shown in FIG. 9. If the solar cells 3 in these cord-form solar cells 23 are indicated by diode symbols in the figures, then the equivalent circuit 24 of the solar cells 23 is as shown in FIG. 11. Here, the 20 solar cells 3 are connected in parallel, the end parts of the positive pole wire members 4a constitute positive pole terminals 25a, and the end parts of the negative pole wire members 4b constitute negative pole terminals 25b.

Next, the functions and advantages of this cord-form solar cell 23 will be described.

Since the respective solar cells 3 each generate an electromotive force with an open-circuit voltage of approximately 0.6 V when the cells receive sunlight with a light intensity of 100 mW/cm², the maximum electromotive force of the cord-form solar cell 23 is approximately 0.6 V. Since this cord-form cylindrical is covered by a transparent light-transmitting covering material 22, most of the light that is incident inside the covering material 22 reaches the solar cells 3; accordingly, the light utilization rate is high, so that the power generating efficiency is high.

A thin flexible light-weight solar cell that generates a photo-electromotive force with a desired voltage and current can be constructed by lining up a plurality of these cord-form solar cells 23, and connecting these cells in a series connection, parallel connection or series-parallel connection. Such a thin flexible light-weight solar cell can be used as a power supply in various types of mobile electronic devices and the like.

In the manufacturing process of this solar cell 23, a plurality of solar cells 3 are respectively incorporated in the plurality of retaining holes 8 of the retaining plate 2; moreover, intermediate portions in the direction of height of the solar cells 3 are held, and the electrodes 15, 16 of the respective solar cells 3 are connected to the wire members 4a, 4b so that conduction is possible. Accordingly, the disposition and positioning of the numerous solar cells 3, and the electrical connection of these cells to the wire members 4a and 4b, can be accomplished easily and efficiently.

Next, various examples in which the abovementioned embodiment is partially modified will be described.

In addition to cylindrical shape, the shape of the cord-form solar cell 23 may also be an angular column type shape, an oval cylindrical shape, or some other cross-sectional shape. Furthermore, in cases where the cord-form solar cell 23 is used "as is" in rod form, the covering material 22 may be formed as a non-flexible structure using a hard synthetic resin (e.g., a phenol type or epoxy type synthetic resin or the like).

Figure 12:
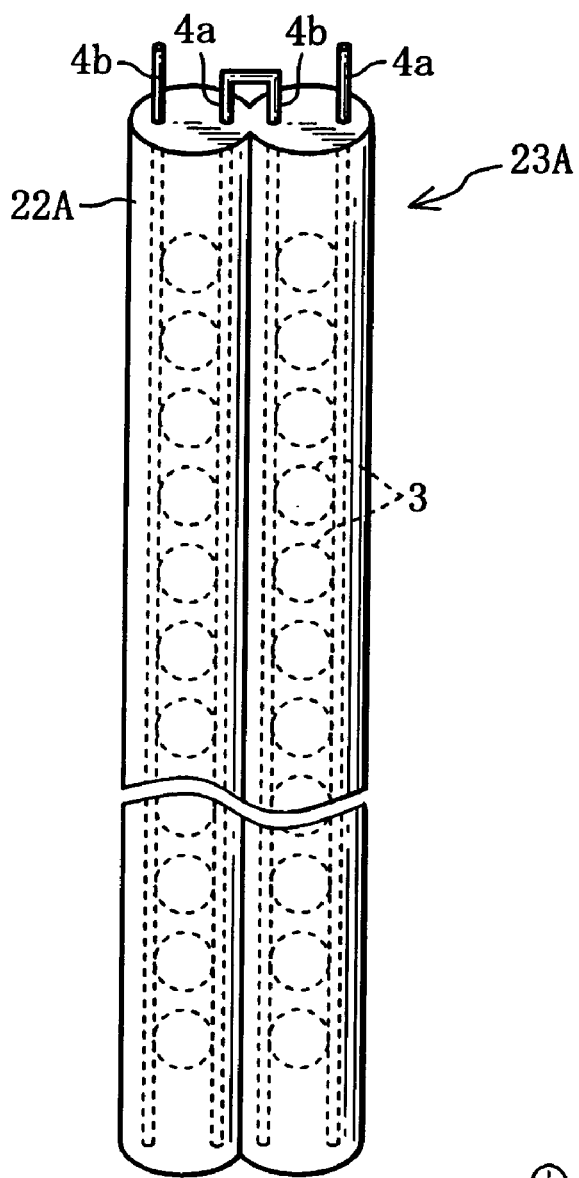
FIG. 12 is a perspective view of a solar cell in which cord-form solar cells are disposed in two rows.
Figure 13:
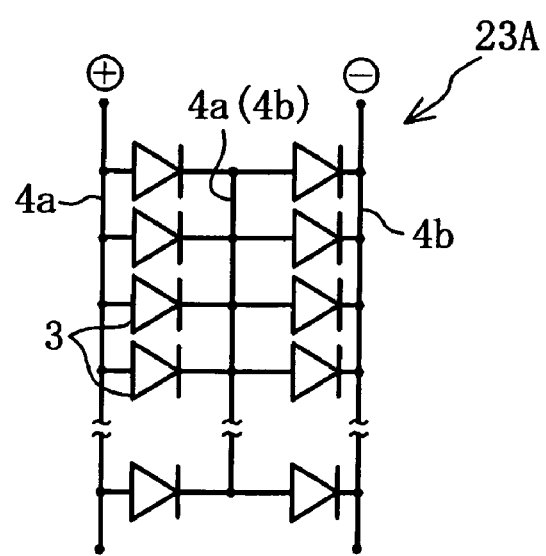
FIG. 13 is a circuit diagram of the equivalent circuit of the solar cell shown in FIG. 12.

Alternatively, as is shown in FIG. 12, a plurality of cord-form solar cells 23 (e.g., two cells) may be lined up in close proximity to each other, and constructed as a solar cell 23A in which the covering materials 22A are formed into an integral unit. In this solar cell 23, the solar cells 3 of the respective columns are connected in parallel by the wire members 4a and 4b, and two columns of solar cells 3 are connected in series via the positive pole wire members 4a and negative pole wire members 4b, so that the photo-electromotive force is approximately 1.2 V as shown in the equivalent circuit in FIG. 13.

Next, a solar cell panel constituting another embodiment of the present invention will be described with reference to FIGS. 14 through 22. This embodiment is one example of a case in which the present invention is applied to a planar or flat-plate-form solar cell panel used as a light receiving device. The method of manufacture and structure of this solar cell panel will be described. Here, parts that are the same as in the abovementioned embodiment are labeled with the same or similar numerals, and a description of such parts is omitted. Furthermore, a description is also omitted in the case of manufacturing steps that are the same as steps in the abovementioned embodiment.

First, in a first step, a temporary fastening plate 1A, a retaining plate 2A and a plurality of solar cells 3 (e.g., 1200 solar cells) are prepared in the same manner as in the abovementioned embodiment.

Figure 14:
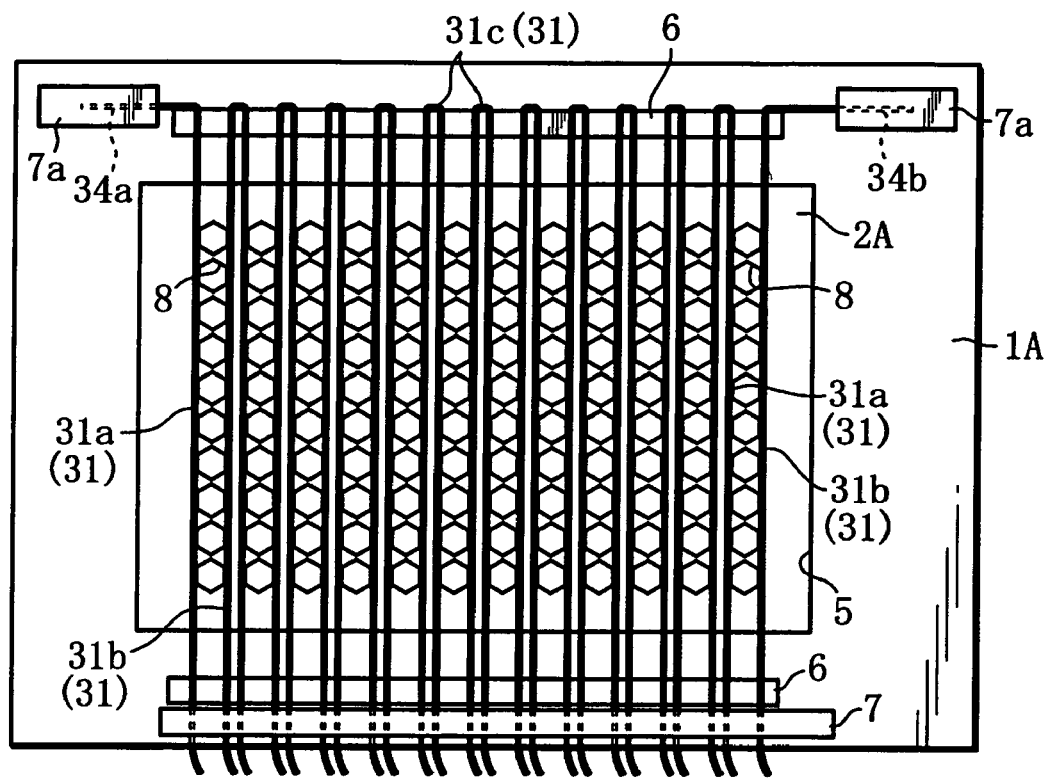
FIG. 14 is a plan view of the temporary fastening plate, retaining plate and conductive wire members in another embodiment.

As is shown in FIG. 14, the temporary fastening plate 1A is similar to the abovementioned temporary fastening plate 1; an opening part 5 and an a pair of projecting strips 6 are formed in this temporary fastening plate 1A. Since this temporary fastening plate 1A is integrated with the covering material 33 (see FIG. 19) that covers the solar cell panel 30 in a subsequent step, this temporary fastening plate 1A is constructed from the same hard synthetic resin as the covering material 33.

A plurality of positive pole wire members 31a and a plurality of negative pole wire members 31b are provided as conductive wire members 31 that have flexibility and conductivity. As in the case of the abovementioned wire members 4a and 4b, these wire members 31 are temporarily fastened in the grooves of the pair of projecting strips 6, and are arranged as shown in the figures.

The positive pole wire members 31a of each column and the positive pole wire members 31b of the adjacent columns are connected by connecting parts 31c. One end portion of each of the plurality of wire members 31a and 31b is temporarily fastened by means of a temporary fastening tape 7. Positive terminals 34a connected to the positive wire members 31a on the left side and negative terminals 34b connected to the negative wire members 31b on the right side are temporarily fastened by means of the temporary fastening tape 7, respectively.

The retaining plate 2A is substantially similar to the abovementioned retaining plate 2; however, 1200 hexagonal retaining holes 8 are formed in this retaining plate 2A in the form of a matrix with 10 rows and 12 columns. The retaining holes 8 of each column are positioned between the respective corresponding sets of wire members 31a and 31b. The solar cells 3 are the same as the solar cells of the abovementioned embodiment; accordingly, a description of these solar cells is omitted.

Figure 15:
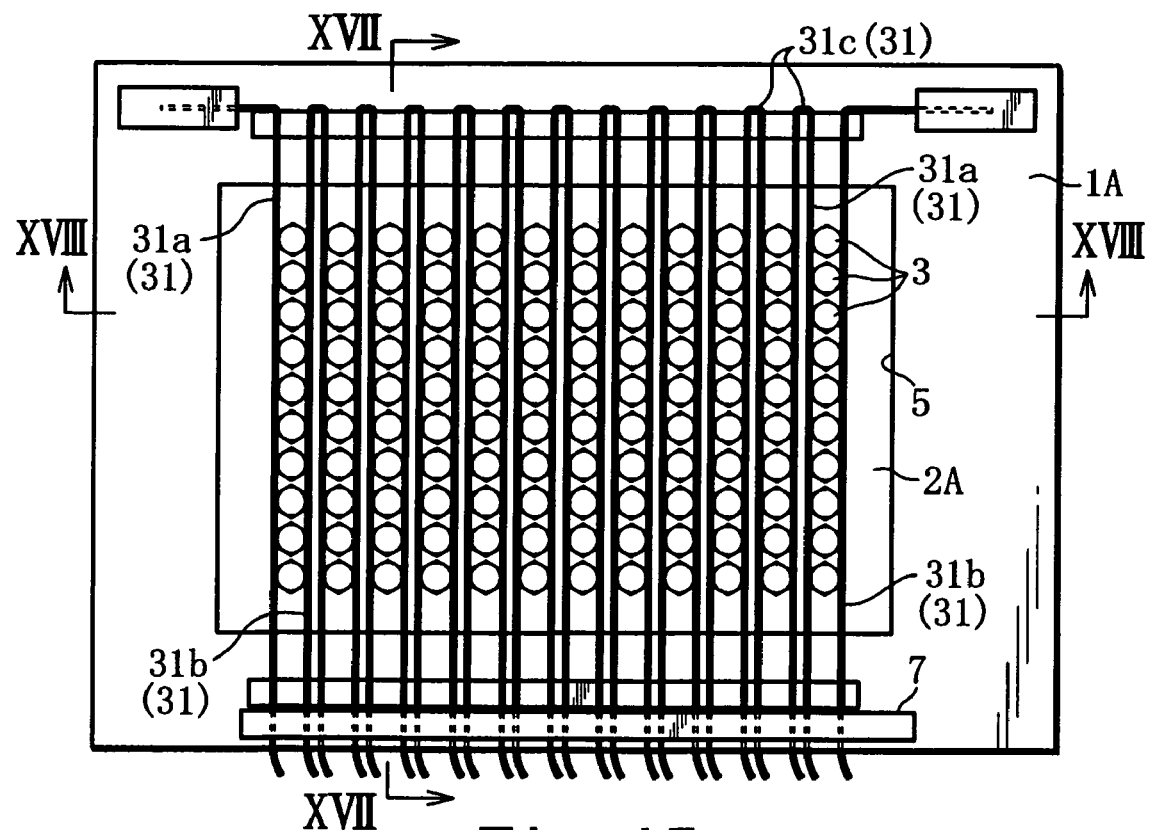
FIG. 15 is a plan view showing solar cells inserted into the retaining holes shown in FIG. 14.

Next, in a second step, as is shown in FIG. 14, the retaining plate 2A is fitted into the opening part 5 of the temporary fastening plate 1A; next, as is shown in FIG. 15, the solar cells 3 are placed in the respective retaining holes 8 of the retaining plate 2A in a state in which the direction of conduction is uniformly arranged, so that the electrodes 15 of the respective solar cells 3 are caused to adhere tightly to the wire members 31a, and so that the electrodes 16 are caused to adhere tightly to the wire members 31b.

Next, in a third step, the solder coating films of the electrodes 15 and 16 of the solar cells 3 of each column are electrically connected to the positive and negative wire members 31a and 31b by irradiation with a heating beam in the same manner as in the abovementioned embodiment.

Figure 16:
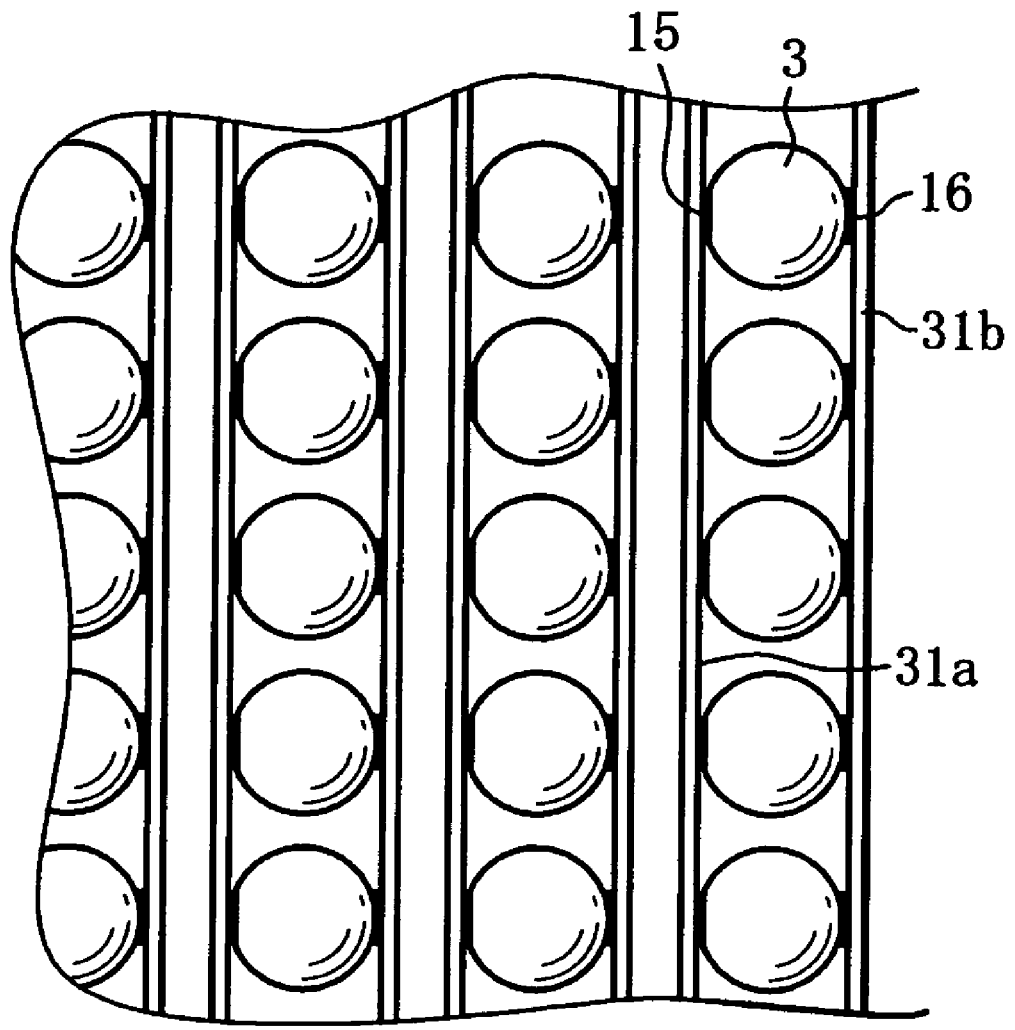
FIG. 16 is an enlarged view of essential parts in FIG. 15, showing a state in which the retaining plate has been removed.
Figure 17:
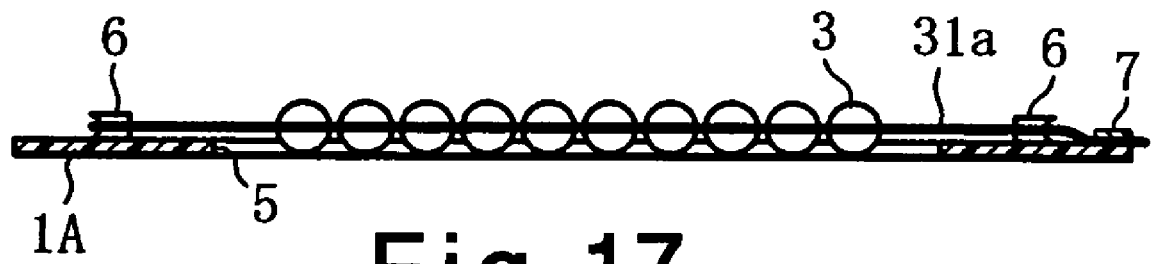
FIG. 17 is a sectional view along XVII-XVII line in FIG. 15 (in a state in which the retaining plate has been removed)
Figure 18:
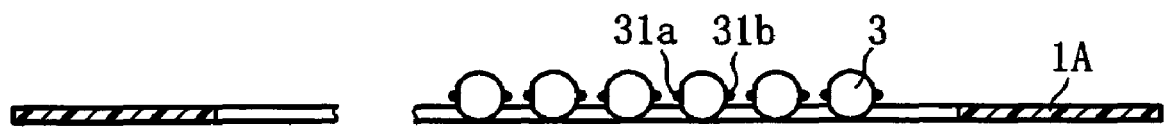
FIG. 18 is a sectional view along XVIII-XVIII line in FIG. 15 (in a state in which the retaining plate has been removed)
Figure 19:
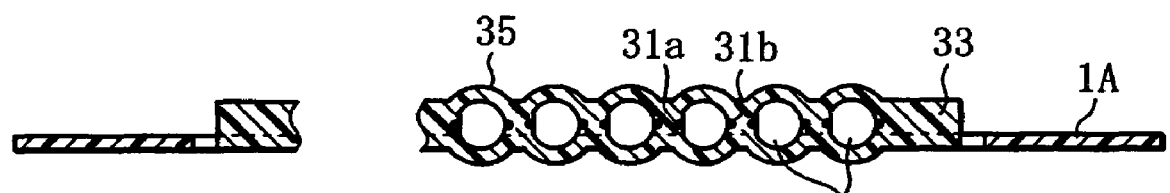
FIG. 19 is a sectional view showing a state in which the solar cell is covered by a covering material (in the state shown in FIG. 18)
Figure 20:
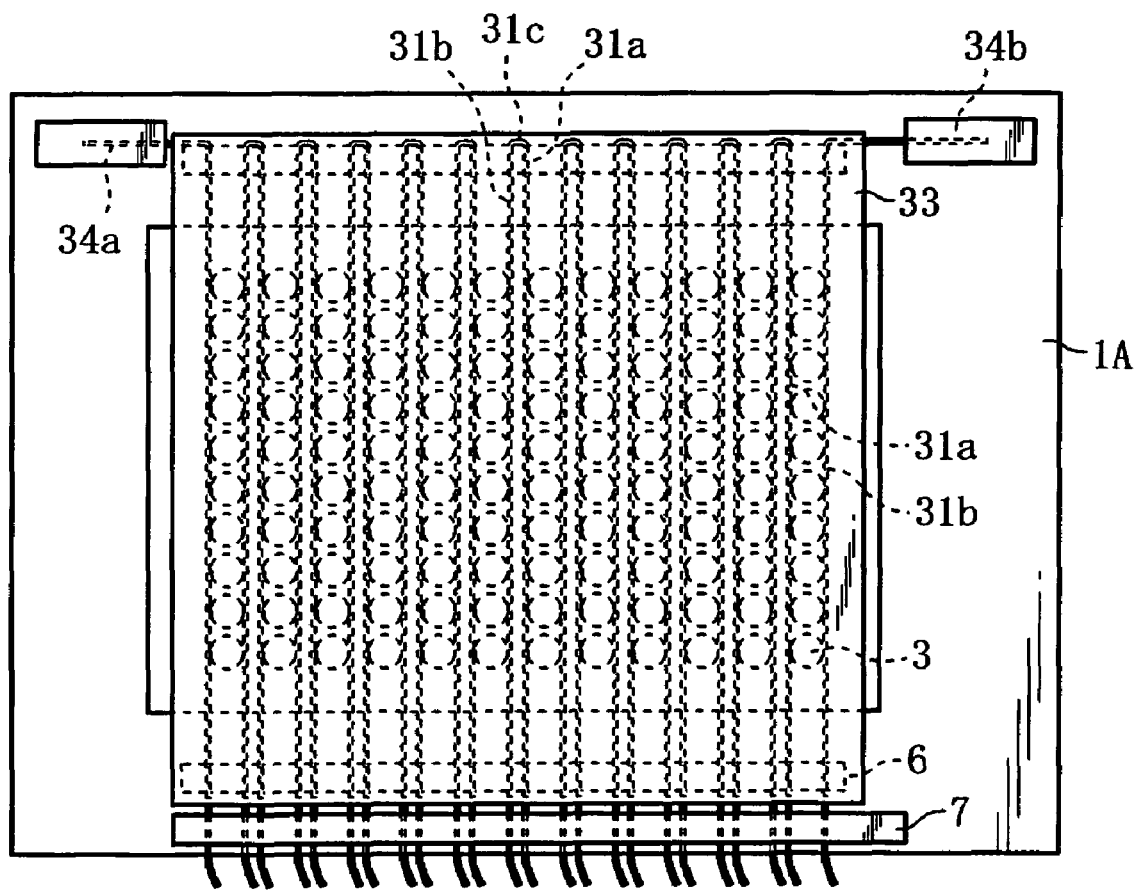
FIG. 20 is a plan view of the covering material, solar cells and conductive wire members.
Figure 21:
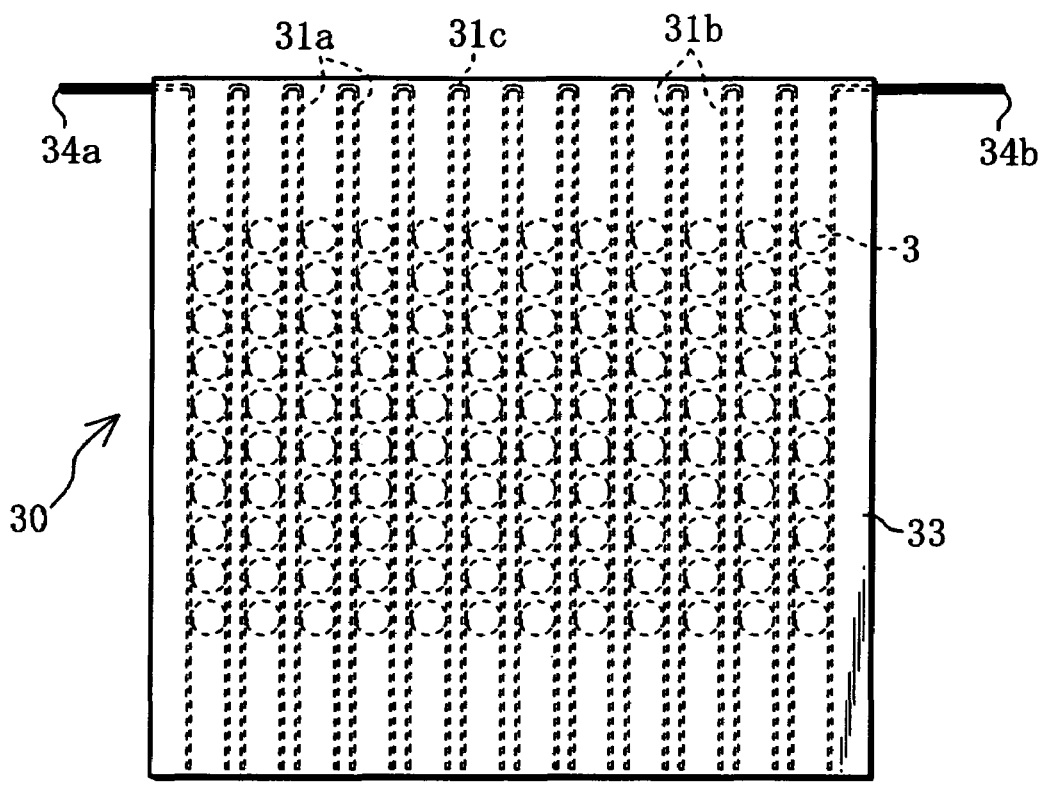
FIG. 21 is a plan view of the solar cell panel.

Next, in a fourth step, as is shown in FIGS. 16 through 18, the retaining plate 2A is removed from the temporary fastening plate 1A. Next, as is shown in FIGS. 19 and 20, the upper and lower surfaces of the numerous solar cells 3 that are positioned and held on the temporary fastening plate 1A via the wire members 31a and 31b are coated with a semi-molten liquid of a transparent soft synthetic resin (e.g., an EVA resin, silicone resin or the like) to a thickness of approximately 500 to 700 μm. Then, these parts are set in a specified metal mold of a molding machine, and a covering material 33 that covers the wire members 31 and all of the solar cells 3 in embedded form is formed by compression molding using an appropriate pressing force. In this case, the positive and negative terminals 34a, 34b are not covered by the covering material 33. Subsequently, when cutting is performed in the position of the outer silhouette line of the covering material 33 without cutting the positive and negative terminals 34a and 34b, a thin plate-form or sheet-form solar cell panel 30 such as that shown in FIG. 21 is completed.

In order to heighten the light receiving performance with respect to sunlight, partially cylindrical lens parts 35 (see FIG. 19) are formed on the surface of the covering material 33 so that these lens parts correspond to the respective columns.

These lens parts 35 focus the incident sunlight, and cause this light to be incident on the solar cells 3. However, in cases where this solar cell panel 30 is incorporated in a specified location and used, the lens parts 35 may be formed on one side only. Moreover, hemispherical lens parts may be formed instead of partially cylindrical lens parts so that these lens parts correspond to the respective solar cells 3. Since this solar cell panel 30 is constructed so that the panel receives sunlight that is incident from above and generates power, the upper surface of the solar cell panel 30 is the surface on the light receiving side, while the undersurface is the surface on the anti-light receiving side. In this solar cell panel 30, since the covering material 33 is formed from a soft synthetic resin, the panel has flexibility.

Figure 22:
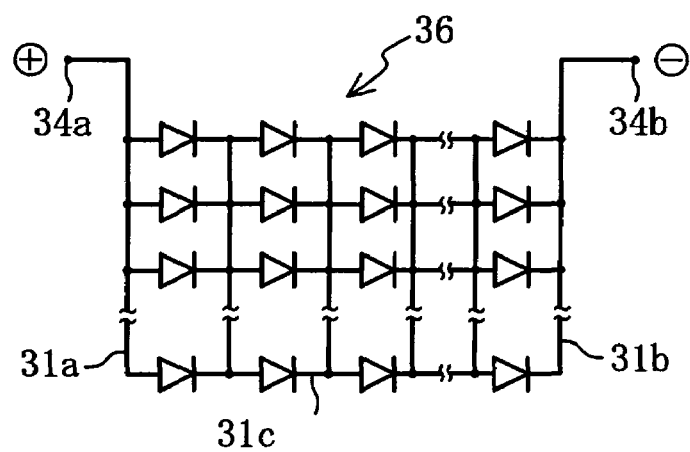
FIG. 22 is a circuit diagram of the equivalent circuit of the solar cell panel shown in FIG. 21.

If the solar cells 3 of this solar cell panel 30 are indicated by diode symbols in the figures, then the equivalent circuit 36 of this solar cell panel 30 is as shown in FIG. 22. The solar cells 3 of each column are connected in parallel by the wire members 31a and 31b, and the solar cells 3 of the respective columns are connected in series with the solar cells 3 of adjacent columns by the connecting parts 31c.

Next, the functions and advantages of this solar cell panel 30 will be described.

Each solar cell 3 generates a photo-electromotive force of approximately 0.6 V when the cell receives sunlight; accordingly, the solar cells 3 of the respective columns also generate a photo-electromotive force of approximately 0.6 V. In this solar cell panel 30, since 12 columns of solar cells 3 are connected in series, the maximum photo-electromotive force is approximately 7.2 V. Furthermore, in cases where a photo-electromotive force exceeding 7.2 V is required, such a photo-electromotive force can be obtained by connecting a plurality of solar cell panels 30 in series via the respective terminals 34a and 34b. Furthermore, in cases where it is desired to increase the current of the photo-electromotive force, this can be accomplished by connecting a plurality of solar cell panels 30 in parallel, and in cases where it is desired to increase both the voltage and the current, this can be accomplished by connecting a plurality of solar cell panels 30 both in parallel and series.

This solar cell panel 30 can be used in household solar power generating systems, various types of solar power generating systems used in mobile entities such as automobiles, electric trains, boats and the like, solar power generating systems used as compact power supplies in electronic equipment or electrical equipment, and other types of solar power generating systems such as chargers or the like. Since the covering material is formed as a flexible structure using a soft synthetic resin, the solar cell panel 30 can be incorporated on curved surfaces, and can be disposed in the form of a cylinder. Accordingly, the solar cell panel 30 can also be disposed and used in a state that conforms to the curved surfaces of various types of objects such as buildings, mobile entities or the like. For example, the solar cell panel can also be used in a state in which this panel is bonded to the surface of an automobile body or to the housing of a notebook computer. Furthermore, since the wire members 31 are also flexible, the solar cell panel 30 can also be molded into a curved shape at the time of molding.

In this solar cell panel 30, solar cells 30 are disposed in the retaining holes 8 formed in the retaining plate 2A, intermediate portions in the direction of height of the solar cells 30 are held in the retaining holes 8, and the electrodes 15 and 16 of the respective solar cells 3 are joined with the wire members 31a and 31b by means of a heating beam. Accordingly, the disposition and positioning of the numerous solar cells 3 can be accomplished easily and efficiently.

The numerous solar cells 3 are connected in series and parallel by means of the wire members 31a and 31b; accordingly, even in cases where solar cells 3 that do not operate normally are present as a result of shade or some trouble, the current generated by normal solar cells 3 bypasses the solar cells 3 that are not operating normally, so that the drop in output can be minimized, and so that the system is superior in terms of reliability. Furthermore, since a plurality of lens parts 35 are formed on the solar cell panel 30, even if the angle of incidence of the sunlight should vary, reflection at the surface can be suppressed, and the sunlight can be focused and directed onto the solar cells 3; accordingly, the utilization rate of the sunlight can be increased.

However, in cases where the solar cell panel 30 is used in planar disposition, the covering material 33 may also be constructed from a transparent hard synthetic resin material (e.g., an acrylic type resin, epoxy type resin, polyethylene type resin, polycarbonate or the like).

Next, examples in which the structure and method of manufacture of the abovementioned solar cell panel 30 are partially modified will be described.

Figure 23:
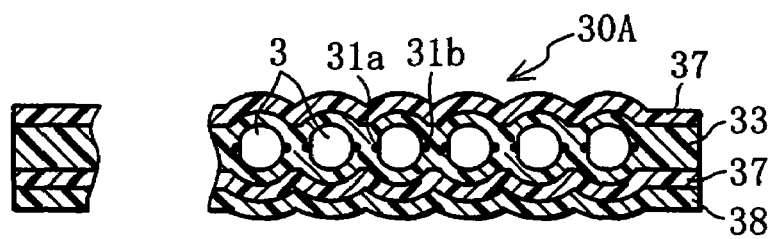
FIG. 23 is a sectional view of a modification of the solar cell panel.

1) As is shown in FIG. 23, a protective film 37 made of a hard synthetic resin is formed on the surface of the solar cell panel 30A. The covering material 33 can be protected by the protective film 37, so that durability can be ensured, and a drop in performance can be prevented. Furthermore, in cases where the solar cell panel 30A is used in a fixed disposition, light that was not received by the solar cells 3 can be reflected toward the solar cells 3 by installing a reflective film 38 or reflective plate on the surface located on the opposite side from the surface on which sunlight is incident; accordingly, the efficiency of power generation can be increased.

Figure 24:
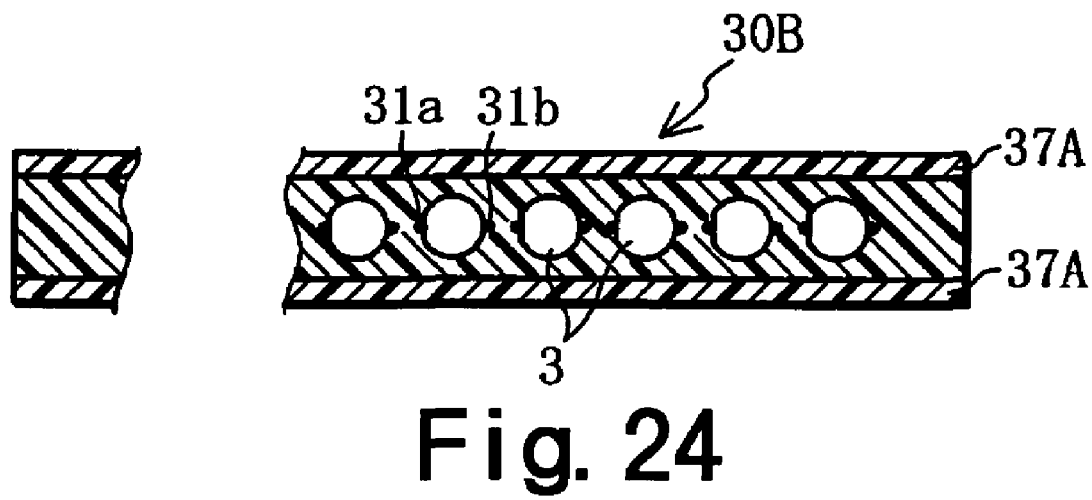
FIG. 24 is a sectional view of another modification of the solar cell panel.

2) In the solar cell panel 30B shown in FIG. 24, both the upper surface and undersurface are constructed as flat surfaces, and a protective film 37A made of a hard synthetic resin or a protective plate made of glass is disposed on both the upper surface and undersurface.

Figure 25:
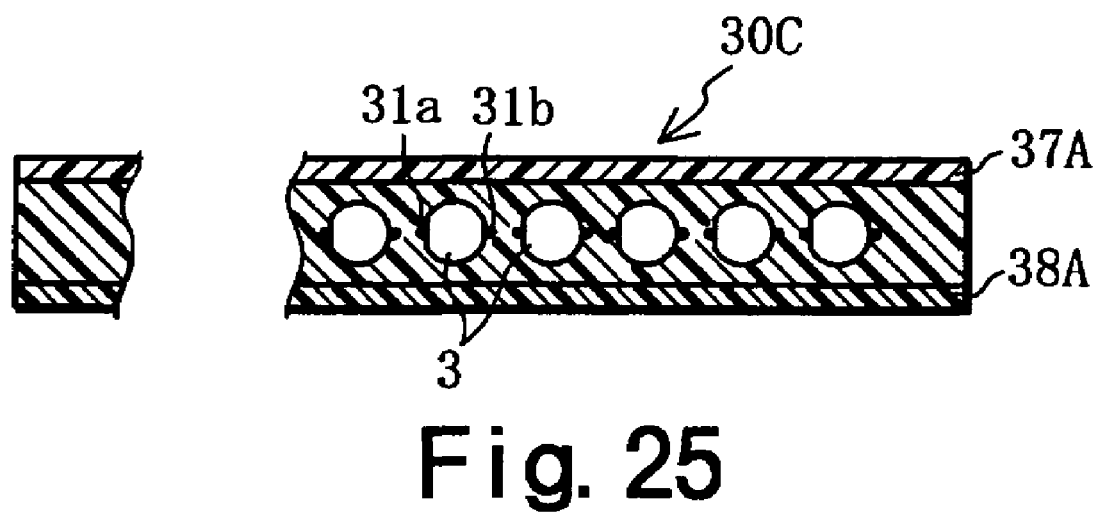
FIG. 25 is a sectional view of another modification of the solar cell panel.

3) In the solar cell panel 30C shown in FIG. 25, both the upper surface and undersurface are constructed as flat surfaces; a protective film 37A made of a hard synthetic resin is disposed on the upper surface, and a reflective film 38A made of a metal film or metal plate is disposed on the undersurface. Since the upper surface on which the protective film 37A is formed is caused to face the side on which the sunlight is incident, the sunlight that passes through the solar cell panel 30C is also reflected by the reflective film 38A and reused; accordingly, the efficiency of power generation is improved.

Figure 26:
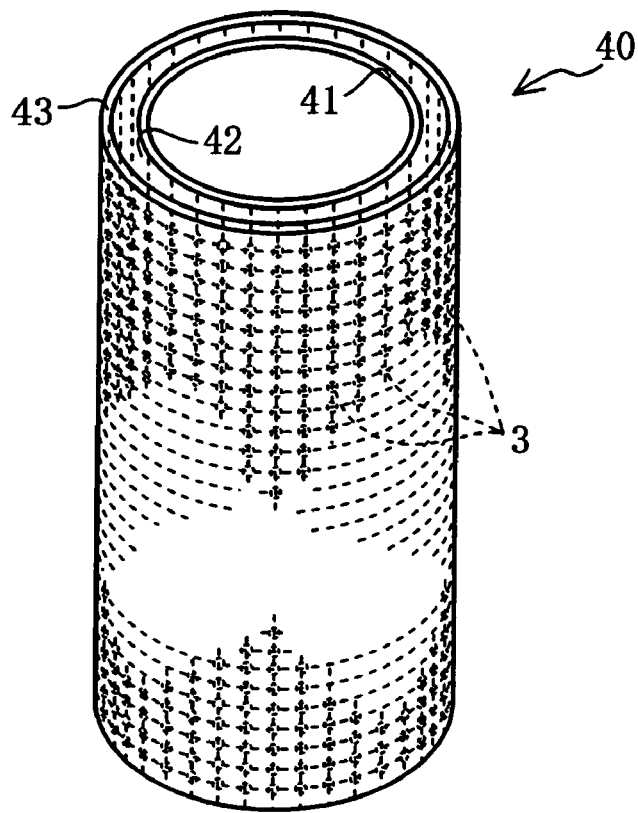
FIG. 26 is perspective view of a cylindrical solar cell.

4) The cylindrical solar cell 40 shown in FIG. 26 is constructed from an inner tube 41 that is made of a transparent or opaque synthetic resin or metal, a flexible solar cell panel 42 which is bent into a cylindrical shape and bonded to the surface of this inner tube 41, and an outer tube 43 used as a surface protecting body which is made of glass or a transparent synthetic resin, and which is fit over the abovementioned solar cell panel 42.

Figure 27:
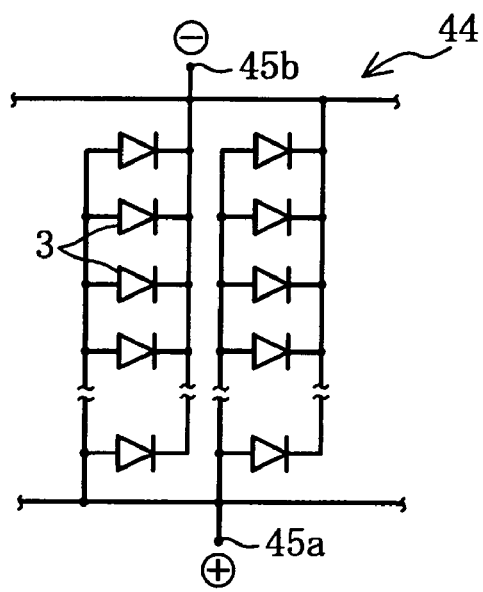
FIG. 27 is a circuit diagram of the equivalent circuit of the cylindrical solar cell shown in FIG. 26.

In this solar cell panel 42, as in the abovementioned solar cell panel 30, solar cells 3 are disposed in the form of a matrix with a plurality of rows and a plurality of columns. A positive pole terminal 45a and negative pole terminal 45b are also provided, as is shown in the equivalent circuit (see FIG. 27) of this solar cell panel 40.

Here, however, instead of the abovementioned inner tube 41, it would also be possible to use a semi-cylindrical body, partially cylindrical body, hollow spherical body, semi-hollow spherical body, partially hollow spherical body or curved-surface body with a curved surface consisting of the same material as that described above, and to use a construction in which a light emitting panel is bonded to the surface of one of these bodies, and a surface protecting body made of glass or a transparent synthetic resin is bonded to the surface of this light emitting panel.

5) Various types of transparent synthetic resin materials (e.g., epoxy type synthetic resins, acrylic type synthetic resins, silicone resins, polyethylene type synthetic resins, polycarbonates, polyimides, methacrylic resins and the like) can be used as the synthetic resin material that forms the covering material in the abovementioned solar cell panel. Alternatively, both the abovementioned temporary fastening plate 1A and covering material 33 can be constructed from a flexible synthetic resin, so that the solar cell panel is made easily deformable.

6) In the abovementioned embodiments, solid solar cells 3 were described as an example. However, hollow solar cells (not shown in the figures) that have a light-to-electricity transducing function may also be used. Such hollow solar cells are cells in which the element main body 11 consisting of p type (or n type) silicon is hollow. In cases where such hollow element main bodies are manufactured, p type silicon melted in a quartz crucible is dropped as liquid droplets containing gas bubbles inside a dropping tube from the tip end of a quartz nozzle, and these liquid droplets are solidified into a spherical shape while being dropped. In this case, liquid droplets containing gas bubbles can be formed by filling the interiors of the liquid droplets of molten silicon with a specified amount of an inert gas such as argon or the like immediately prior to the dropping of the molten p type silicon inside the dropping tube from the tip end of the quartz nozzle.

7) In regard to the solar cells 3 of the abovementioned solar cell panels, a case in which silicon was used as the semiconductor was described as an example; however, p type or n type Ge can also be used as the semiconductor that forms the element main bodies of the solar cells 3, and various types of compound semiconductors (e.g., GaAs, GaSb, InSb, InP, InAs or the like) can also be used.

8) An inverter circuit that converts the direct-current power generated by the solar cell panel into alternating-current power, and various types of switches, wiring and the like, can be incorporated in the extra space on the outer circumferential side of the solar cell panel.

9) In the abovementioned embodiments, a solar cell panel used as a light receiving panel, which used solar cells 3 as particulate semiconductor elements, was described as an example. However, particulate light-emitting diodes that have an electricity-to-light transducing function can be used instead of solar cells 3. If a construction is used in which such light-emitting diodes are connected in series in a plurality of stages, and a substantially specified direct-current voltage is applied to the light-emitting diodes of the respective stages, a light-emitting panel or display that shows surface light emission can be constructed.

The method used to manufacture such particulate light-emitting diodes (spherical light-emitting diodes) is similar to the method proposed by the inventor of the present application in WO 98/15983; accordingly, the structure of these spherical light-emitting diodes will be briefly described here.

Figure 28:
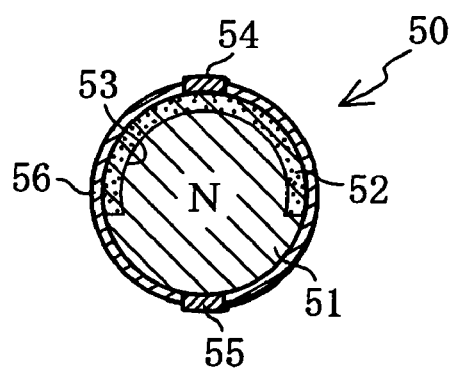
FIG. 28 is a sectional view of a spherical light-emitting diode.

As is shown in FIG. 28, a spherical light-emitting diode 50 comprises an element main body 51 consisting of n type GaAs with a diameter of 1.0 to 1.5 mm, a substantially spherical-surface form p type diffusion layer 52 that is formed in the vicinity of the surface of the element main body 51, a substantially spherical-surface form pn junction 53, an anode 54 and cathode 55, a fluorescent coating film 56 and the like. The element main body 51 is constructed from n type GaAs to which Si is added so that the peak wavelength of the infrared light generated by the pn junction 53 is 940 to 980 nm. The p type diffusion layer 52 is formed by thermally diffusing a p type impurity such as Zn; the impurity concentration at the surface of the p type diffusion layer is $2\sim 8\times 10^{19}/cm^3$.

The fluorescent coating film 56 uses different fluorescent substances according to the color of the light that is emitted. $Y_{0.74}Yb_{0.25}Er_{0.01}OCl$ is used as a fluorescent substance that generates red light, $Y_{0.84}Yb_{0.15}Er_{0.01}F_3$ is used as a fluorescent substance that generates green light, and $Y_{0.65}Yb_{0.35}Tm_{0.001}F_3$ is used as a fluorescent substance that generates blue light.

The abovementioned anode 54 (thickness 1 μm) is constructed from Au to which 1% Zn is added, and the cathode 55 (thickness 1 μm) is constructed from Au to which small amounts of Ge and Ni are added.

In such a particulate light-emitting diode 50, when a voltage of approximately 1.4 V is applied to the cathode 55 from the anode 54, infrared light with a wavelength of approximately 940 to 980 nm is generated from the pn junction of the GaAs, and the fluorescent substance of the fluorescent coating film 56 is excited by this infrared light so that the infrared light is converted into visible light (red light, green light or blue light) that corresponds to the fluorescent substance, and this visible light is output to the outside from the entire surface of the fluorescent coating film.

For example, if all of the solar cells 3 of the abovementioned solar cell panel 30 are caused to mount light-emitting diodes that emit red light, and a direct-current voltage of approximately 1.4 V is applied to the cathode side terminal from the anode side terminal, a light emitting panel is obtained in which red light is emitted by surface light emission from 120 light-emitting diodes. A light emitting panel that generates green light and a light emitting panel that generates blue light can be similarly constructed.

Furthermore, a light emitting panel that can be used as a display for displaying characters, symbols and images in a single color or a plurality of colors can also be constructed. A color display or color television in which light-emitting diodes for the abovementioned R, G and B (red, green and blue) are incorporated can also be constructed as proposed in the abovementioned WO 98/15983. Here, the types and combinations of light-emitting diodes that are incorporated in the light emitting panel, and the disposition configuration of the plurality of light-emitting diodes, are set in accordance with the size and function of the display or television. Furthermore, the diameter of the element main bodies 51 of the particulate light-emitting diodes 50 is not limited to the value described above; this diameter may also be set at a value that is less than 1.0 mm, or a value that is greater than 1.5 mm.

Furthermore, hollow element main bodies can also be used as the element main bodies 51 of the abovementioned spherical light-emitting diodes 50; alternatively, element main bodies in which insulating spherical bodies consisting of an insulating material are incorporated instead of hollow parts may also be used.

Furthermore, not only planar panels, but also light emitting devices formed in a cylindrical shape as shown in FIG. 26, can be formed. Furthermore, instead of the GaAs used as the semiconductor forming the abovementioned element main bodies, GaP, GaN or various other types of semiconductors can be utilized as the semiconductor used in the abovementioned light-emitting diodes. Moreover, the shape is not necessarily limited to spherical; this shape may also be cylindrical or the like.

The invention claimed is:

1. A light receiving or light emitting device comprising:
a plurality of particulate semiconductor elements disposed in at least one column;
each semiconductor element of said plurality of elements having a light-to-electricity transducing function or an electricity-to-light transducing function;
each semiconductor element in said at least one column including opposing end parts and a pair of opposing electrodes disposed on said opposing end parts;
said pair of opposing electrodes interposing a center of each semiconductor between said pair of opposing electrodes;
an axis between each pair of opposing electrodes being perpendicular to a longitudinal axis of said at least one column;
said at least one column including flexible wires connecting in parallel each semiconductor element disposed in said at least one column;
a space provided between adjacent semiconductor elements in said at least one column so that said at least one column is capable of being flexed; and
a flexible covering material covering and embedding each semiconductor element and each wire in said at least one column.

2. The device of claim 1, further comprising:
another column of said plurality of semiconductor elements;
said other column of semiconductor elements including said flexible wires connecting in parallel each semiconductor element disposed in said other column of semiconductor elements;
one wire of said wires in said at least one column of semiconductor elements being connected to one wire of said wires in said other column of semiconductor elements for connecting in series said at least one column of semiconductor elements to said other column of semiconductor elements; and
the flexible covering material covering and embedding each semiconductor element and each wire in said at least one column of semiconductor elements and said other column of semiconductor elements.

3. The device of claim 1, comprising:
a plurality of said columns of semiconductor elements arranged juxtaposed to one another;

each column of semiconductor elements including said flexible wires for connecting in parallel each semiconductor element disposed in each column of semiconductor elements;

one wire of said wires in each column of semiconductor elements being connected to one wire of said wires in each adjacent column of semiconductor elements for connecting in series each adjacent column of semiconductor elements; and the flexible covering material covering and embedding each semiconductor element and each wire in each of said columns of semiconductor elements so that the device forms a flexible panel.

4. A light receiving or light emitting device according to claim 1, wherein said wires and covering material form an elongated flexible member.

5. The device of claim 2 or 3, wherein the semiconductor elements in each column are connected in series to semiconductor elements in one or more columns adjacent to the column by said wires.

6. The device of claim 1, wherein said semiconductor elements comprise a spherical element main body made of p type or n type semiconductor, and a pn junction, and said pair of electrodes are connected to both ends of said pn Junction.

7. The device of claim 1, wherein said semiconductor elements comprise a cylindrical element main body made of p type or n type semiconductor, and a pn junction, and said pair of electrodes are connected to both ends of said pn junction.

8. The device of claim 2 or 3, wherein said semiconductor elements consist of light receiving elements, and the device is a solar cell panel that receives sunlight and converts the light into electricity.

9. The device of claim 2 or 3, wherein said semiconductor elements comprise light emitting elements, and the device is a surface-emitting light emitting panel.

10. The device of claim 2 or 3, wherein partially cylindrical lens parts that correspond to the semiconductor elements of the respective columns are disposed adjacent to a surface of said covering material.

11. The device of claim 2 or 3, wherein a protective film is formed on at least one surface of said covering material.

12. The device of claim 2 or 3, wherein a reflective film that reflects light is formed on any one or more surface portions of said covering material.

13. A method for manufacturing a light receiving or light emitting device in which a plurality of particulate semiconductor elements that have a light-to-electricity transducing function or an electricity-to-light transducing function are incorporated lined up in at least one column, comprising:

a first step in which a plurality of semiconductor elements, a temporary fastening plate to which plural conductive wire members are temporarily fastened and a retaining plate having a plurality of retaining hales are prepared;

a second step in which said retaining plate is fitted into an opening part of the temporary fastening plate, respective semiconductor elements are fitted in the retaining holes, and intermediate portions in the direction of height of the semiconductor elements are held by the retaining holes; and a third step in which the pairs of electrodes of said semiconductor elements are electrically connected to the conductive wire members.

14. The light receiving or light emitting device according to claim 13, wherein in the third step, the pairs of electrodes of the semiconductor elements are electrically connected to the conductive wire members by irradiating a metal film with a low melting point formed on the surface of said pairs of electrodes with a heating beam.

* * * * *

UNITED STATES PATENT AND TRADEMARK OFFICE
CERTIFICATE OF CORRECTION

PATENT NO.       : 7,220,997 B2
APPLICATION NO.  : 10/511959
DATED            : May 22, 2007
INVENTOR(S)      : Josuke Nakata It is certified that error appears in the above-identified patent and that said Letters Patent is hereby corrected as shown below:

Item (54)
The Title for this application is incorrect. Please correct the Title of this application from:

"LIGHT RECEIVING OR LIGHT EMITTING DEVICE
AND ITSD PRODUCTION METHOD"

to

--LIGHT RECEIVING OR LIGHT EMITTING DEVICE AND METHOD
OF MANUFACTURING THE SAME--.

Signed and Sealed this

Thirtieth Day of October, 2007

JON W. DUDAS
*Director of the United States Patent and Trademark Office*